United States Patent
Jang et al.

(10) Patent No.: US 8,149,349 B2
(45) Date of Patent: Apr. 3, 2012

(54) LIQUID CRYSTAL DISPLAY MODULE

(75) Inventors: Ji-Hwan Jang, Seoul (KR); Jae-Lok Cha, Goyang-si (KR); Sang-Hee Lee, Suwon-si (KR); Kyoung-Don Lee, Suwon-si (KR); Hwan-Jin Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1011 days.

(21) Appl. No.: 12/058,923

(22) Filed: Mar. 31, 2008

(65) Prior Publication Data
US 2008/0239193 A1 Oct. 2, 2008

(30) Foreign Application Priority Data

Apr. 2, 2007 (KR) .................. 10-2007-0032309

(51) Int. Cl.
*G02F 1/1333* (2006.01)
(52) U.S. Cl. ......................................................... 349/58
(58) Field of Classification Search ...................... 349/58
See application file for complete search history.

(56) References Cited

U.S. PATENT DOCUMENTS

| | | | | |
|---|---|---|---|---|
| 6,862,053 B2 * | 3/2005 | Lee et al. | ......................... | 349/58 |
| 7,453,532 B2 * | 11/2008 | Kondo et al. | ................... | 349/58 |
| 7,542,105 B2 * | 6/2009 | Sato et al. | ....................... | 349/58 |
| 7,586,744 B2 * | 9/2009 | Okuda | ..................... | 361/679.56 |
| 2007/0252922 A1 * | 11/2007 | Oohira | ............................. | 349/58 |

FOREIGN PATENT DOCUMENTS

| | | |
|---|---|---|
| CN | 1717618 A | 1/2006 |
| JP | 05341309 | 12/1993 |
| JP | 2001125072 | 5/2001 |
| JP | 2005-338497 A | 8/2005 |
| KR | 1020050065826 A | 6/2005 |

\* cited by examiner

*Primary Examiner* — Mark Robinson
*Assistant Examiner* — Charles Chang
(74) *Attorney, Agent, or Firm* — Cantor Colburn LLP

(57) ABSTRACT

A liquid crystal display ("LCD") module includes an LCD panel, a light source unit, a mold frame, a bottom chassis and a driving circuit substrate. The light source unit supplies light to the LCD panel. The mold frame includes a bottom part and sidewall part, and receives the LCD panel and the light source unit. The bottom chassis covers the mold frame and includes a first opening. The driving circuit substrate is disposed between the mold frame and the bottom chassis, and includes a circuit component. The circuit component is formed corresponding to the first opening.

22 Claims, 6 Drawing Sheets

LIQUID CRYSTAL DISPLAY MODULE

This application claims priority under 35 U.S.C. §119 to Korean Patent Application No. 2007-32309, filed on Apr. 2, 2007, and all the benefits accruing therefrom under 35 U.S.C. §119, the contents of which are herein incorporated by reference in their entirety.

BACKGROUND OF THE INVENTION

1. Field of the Invention

The present invention relates to a liquid crystal display ("LCD") module. More particularly, the present invention relates to an LCD module having a slim thickness.

2. Description of the Related Art

A liquid crystal display ("LCD") apparatus is used as a small display apparatus in a mobile phone, a portable game device, a portable display device and so on.

The LCD apparatus employs a light source and a light source unit because an LCD module cannot emit by itself. Furthermore, a driving circuit substrate is employed for driving the LCD apparatus.

A thickness of the LCD apparatus may be greater than other types of display apparatuses such as an organic light-emitting diode ("OLED") display apparatus. Small display apparatuses having slimmer thickness are being developed. The LCD apparatus requires a plurality of components for driving. Considering the plurality of components, where a driving circuit substrate is disposed at a rear surface of a bottom chassis covering a mold frame, a separate fixing member, such as a double-side tape, may be used for attaching the driving circuit substrate to the bottom chassis.

BRIEF SUMMARY OF THE INVENTION

Since the LCD apparatus requires a plurality of components for driving, there are technical difficulties in manufacturing an LCD apparatus with a slim thickness. For example, a total thickness of the LCD module increases with the addition of a separate fixing member attaching the driving circuit substrate to the rear surface of a receiving container. Furthermore, the driving circuit substrate is vulnerable and exposed to the exterior of the LCD module, so that the driving circuit substrate may be easily damaged by other components contacting the driving circuit substrate.

An exemplary embodiment provides a liquid crystal display ("LCD") module having a slim thickness and protecting a driving circuit substrate.

An exemplary embodiment of an LCD module includes an LCD panel, a light source, a mold frame, a bottom chassis and a driving circuit substrate. The light source unit supplies light to the LCD panel. The mold frame includes a bottom part and sidewall part, and receives the LCD panel and the light source unit. The bottom chassis is disposed at a rear of the mold frame, covers the mold frame and includes a first opening. The driving circuit substrate is disposed between the mold frame and the bottom chassis, and includes a component. The component is disposed corresponding to the opening.

In an exemplary embodiment, the driving circuit substrate may include an LCD panel driving part. The driving circuit substrate may include a light source driving part.

In an exemplary embodiment, the driving circuit substrate may include a flexible printed circuit board ("FPCB"). The LCD module may further include a first connecting part electrically connecting the LCD panel and the driving circuit substrate. The first connecting part may extend from the driving circuit substrate and pass through an opening of the mold frame from the driving circuit substrate. The first connecting part may be bent along the exterior of the mold frame, and may be electrically connected to the LCD panel.

In an exemplary embodiment, the first connecting part may be integral and directly connected with the driving circuit substrate. Alternatively, the first connecting part may be electrically connected to the driving circuit substrate through a connector.

In an exemplary embodiment, the LCD module may further include a second connecting part electrically connecting the light source unit and the driving circuit substrate. The second connecting part may be integral and directly connected with the driving circuit substrate. Alternatively, the second connecting part may be electrically connected to the driving circuit substrate through a connector.

In an exemplary embodiment, the driving circuit substrate may include a soldering part. The soldering part is disposed corresponding to a second opening of the bottom chassis. The second connecting part is electrically connected to the driving circuit substrate at the soldering part.

In an exemplary embodiment, the driving circuit substrate may be disposed substantially coincident with a part or all of a sidewall of the bottom chassis, and fixed when the bottom chassis covers the mold frame. A combination protrusion may be disposed at a rear surface of the mold frame, a combination groove corresponding to the combination protrusion may be disposed at the driving circuit substrate, and the driving circuit substrate is fixed in the mold frame when the combination protrusion and the combination groove are combined.

In an exemplary embodiment, a combination protrusion may be disposed at the chassis, and a combination groove corresponding to the combination protrusion may be disposed at the driving circuit substrate, and the driving circuit substrate is fixed in the mold frame when the combination protrusion and the combination groove are combined.

In an exemplary embodiment, the light source unit may include a light-emitting diode ("LED") device. The light source unit may include a light-guide plate ("LGP").

In an exemplary embodiment, the LCD module may further include a plurality of optical sheets disposed between the LGP and the LCD panel. The LCD module may further include a reflective sheet disposed between the light source unit and the mold frame.

In an exemplary embodiment, the bottom part of the mold frame may include a second opening. The driving circuit substrate may include a connector part. The connector part corresponds to a second opening of the bottom chassis. The connector part is electrically connected to an exterior device.

In an exemplary embodiment, a height of the component of the driving circuit substrate may be substantially the same as a thickness of the bottom chassis, or greater than the thickness of the bottom chassis. The bottom chassis may include at least one bent surface corresponding to the sidewall part of the mold frame, the bent surface preventing the driving circuit substrate from moving or getting scratched.

In an exemplary embodiment, the first opening of the bottom chassis may be disposed adjacent to an edge of the bottom chassis. Alternatively, the first opening may be disposed at a center of the bottom chassis corresponding to the component of the driving circuit substrate.

In an exemplary embodiment, of the display substrate, openings in a bottom portion of a bottom chassis are disposed corresponding to a component of a driving circuit substrate. Thus, an LCD module may be assembled to be thinner by a height of the component of the driving circuit substrate.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
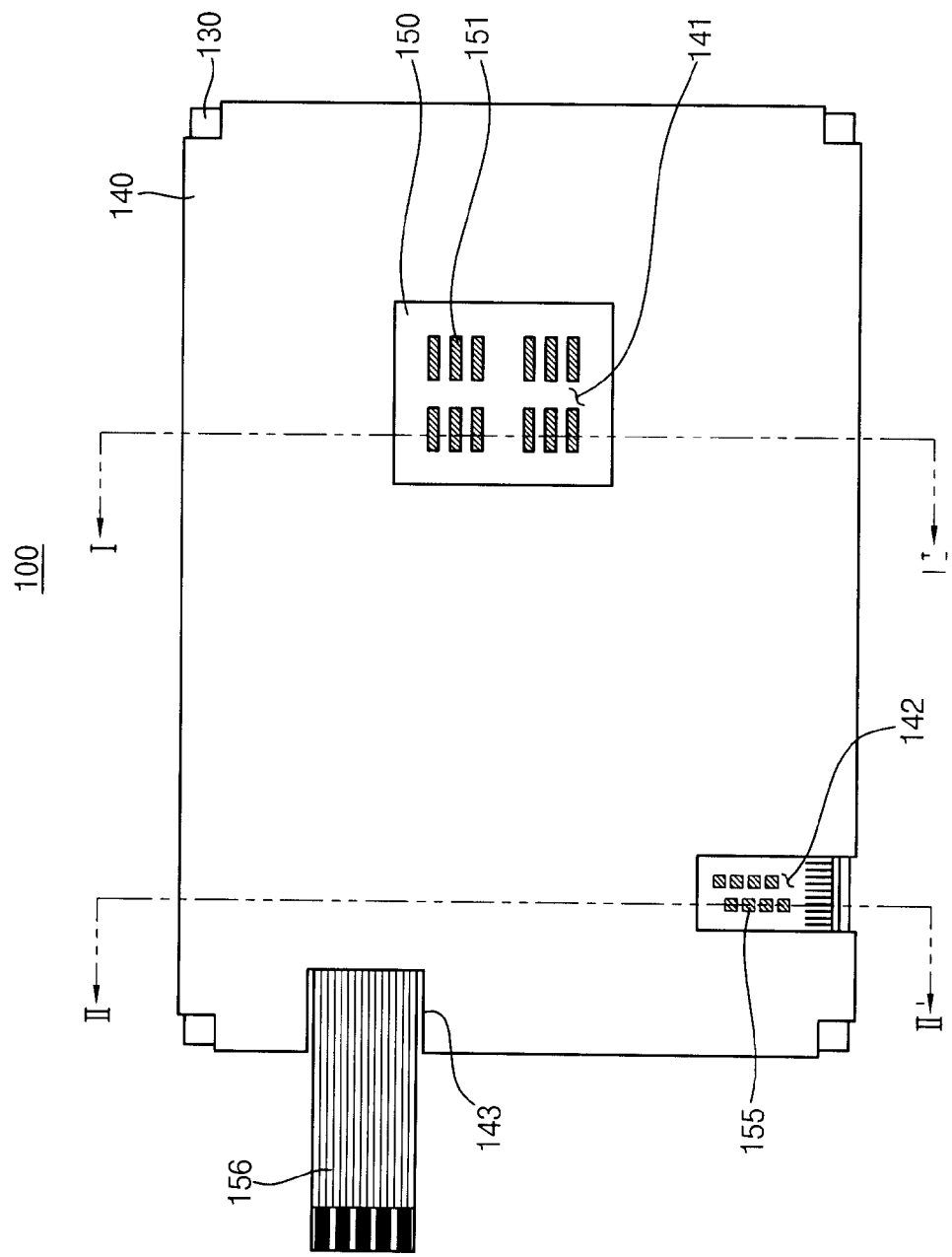
FIG. 1 is a plan view illustrating an exemplary embodiment of a liquid crystal display ("LCD") module in accordance with the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "upper," "rear," "front" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "upper" or "front" other elements or features would then be oriented "lower" or "rear" to the other elements or features. Thus, the exemplary term "upper" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
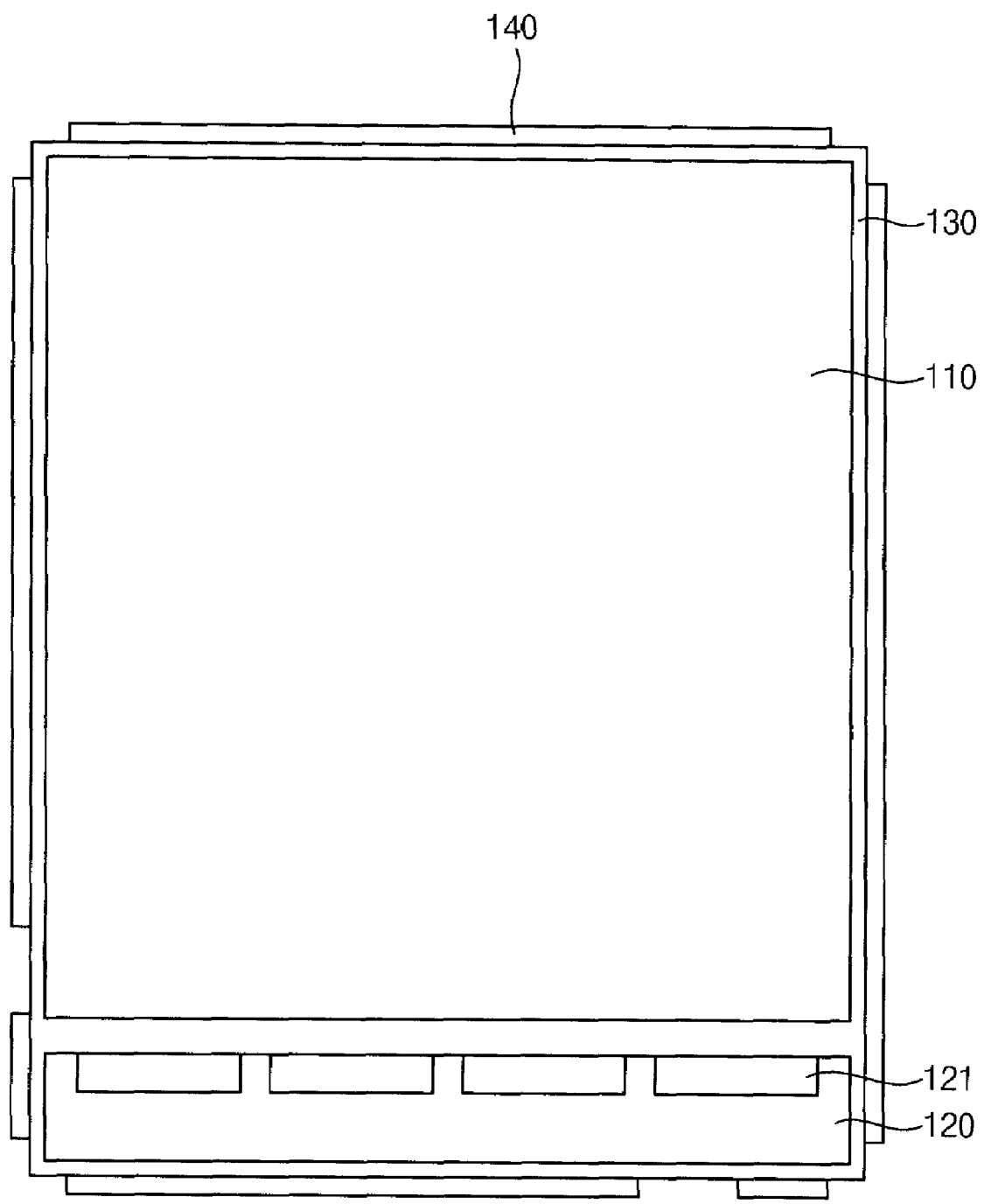
FIG. 2 is a plan view illustrating an exemplary embodiment of a rear surface of the LCD module in FIG. 1.

FIG. 1 is a plan view illustrating an exemplary embodiment of a liquid crystal display ("LCD") module in accordance with the present invention. FIG. 2 is a plan view illustrating an exemplary embodiment of a rear surface of the LCD module in FIG. 1.

Referring to FIGS. 1 and 2, an LCD module 100 includes an LCD panel 110, a light source unit 120, a mold frame 130, a bottom chassis 140 and a driving circuit substrate 150.

The LCD panel 110 displays images based on an input signal, such as by changing an arrangement of liquid crystal molecules.

The light source unit 120 includes a light source generating light and a light-guide plate ("LGP") (not shown). The light source (not shown) may be formed at a side of the LCD panel 110, and the LGP (not shown) may be disposed at a rear surface of the LCD panel 110. The light generated by the light source (not shown) is provided to the LCD panel 110 through the LGP.

The light source of the light source unit 120 may include, but is not limited to, a light-emitting diode ("LED"). The light source unit 120 may include a flexible printed circuit board ("FPCB") having a relatively slim thickness for simplifying arrangement and assembly. In an exemplary embodiment, a plurality of LEDs may be formed on the FPCB of the light source unit 120.

The mold frame 130 receives the light source unit 120 and the LCD panel 110. The mold frame 130 includes a sidewall part and a bottom part. The sidewall part extends in a substantially perpendicular direction with respect to sides (e.g., edges) of the bottom part. A receiving space is defined by the sidewall part and the bottom part of the mold frame 130. The light source unit 120 and the LCD panel 110 are received in the receiving space of the mold frame 130.

In an exemplary embodiment, the light source unit 120 and the LCD panel 110 may be received and supported on a stepped portion formed at the sidewall part of the mold frame 130. The light source unit 120 and the LCD panel 110 may be combined with the mold frame 130 including a groove structure.

The mold frame 130 may have a substantially frame shape and/or may include an opening. When the mold frame 130 includes the bottom part without the opening, the bottom part supports the LGP and a reflective sheet (not shown) of the light source unit 120.

Alternatively, when the mold frame 130 includes the opening, the driving circuit substrate 150 and/or the bottom chassis 140 may support the LGP and the reflective sheet. Advantageously, when the mold frame 130 includes the opening, a total thickness of the LCD module 100 may be reduced, such as by an amount corresponding to a thickness of the bottom part of the mold frame 130. The bottom chassis 140 and/or the driving circuit substrate 150 may include a component for supporting the LGP and the reflective sheet, instead of the bottom part.

Figure 3A:
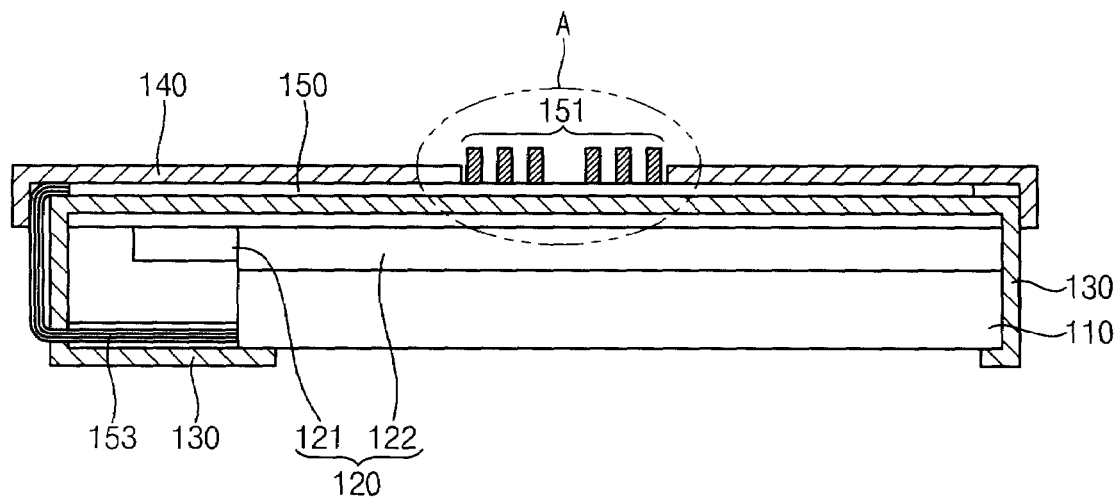
FIG. 3A is a cross-sectional view illustrating the LCD module in FIG. 1, which is taken along line I-I'.

The bottom chassis 140 includes first, second and third openings 141, 142 and 143. The bottom chassis 140 covers the mold frame 130 as illustrated in the rear view of the LCD module 100 FIG. 2. The driving circuit substrate 150 is disposed between the bottom chassis 140 and the mold frame 130 (FIG. 3A). The bottom chassis 140 protects the mold frame 130, the LCD panel 110 and the light source unit 120 received in the mold frame 130, and the driving circuit substrate 150.

The driving circuit substrate 150 includes an electrical circuit component 151 and a fixing part 155, hereinafter referred to as a soldering part. The electrical circuit component 151 may include an electronic chip and/or an electronic component for driving the LCD panel 110, and is mounted on the driving circuit substrate 150. The driving circuit substrate 150 may include an FPCB.

In an exemplary embodiment, the driving circuit substrate 150 may be divided into an LCD panel driving part and a light source driving part. The LCD panel driving part and the light source driving part may be integrally formed, or may be formed separately. As used herein, "integrally" is used to indicate formed to be a single unit or member, rather than a series of or combining separate elements.

The first, second and/or third openings 141, 142 and/or 143 of the bottom chassis 140 may be formed adjacent to sides (or edges) of the bottom chassis 140. Alternatively, the first, second and/or third openings 141, 142 and/or 143 may be formed at a center portion of the bottom chassis 140. The first and second openings 141 and 142 correspond to at least the circuit component 151 and the soldering part 155 of the driving circuit substrate 150, respectively. As used herein, "corresponding" is used to indicate corresponding substantially in shape, size and/or positional placement relative to another feature.

In an exemplary embodiment, the driving circuit substrate 150 may be formed to be coincident with a part of or the entire sidewall of the bottom chassis 140. In the illustrated embodiment, the bottom chassis 140 covers the mold frame 130, such that the bottom chassis 140 includes a shape, which is substantially the same as a shape of the mold frame 130. The shape and/or the form of the bottom chassis 140 corresponds to the shape and/or profile of the mold frame. Thus, the driving circuit substrate 150 may be formed to be coincident with a part or the entire mold frame 130.

The driving circuit substrate 150 is disposed between the bottom chassis 140 and the mold frame 130. The driving circuit substrate 150 may be fixed between the bottom chassis 140 and the mold frame 130 by a combination of the bottom chassis 140 covering the mold frame 130.

As shown in the illustrated embodiment, an additional adhering member, such as a double-sided tape, may not be needed to secure the driving circuit substrate 150 in the LCD module 100. Advantageously, the total thickness of the LCD module 100 may be reduced by a dimension, such as a thickness of the double-sided tape.

Figure 3B:
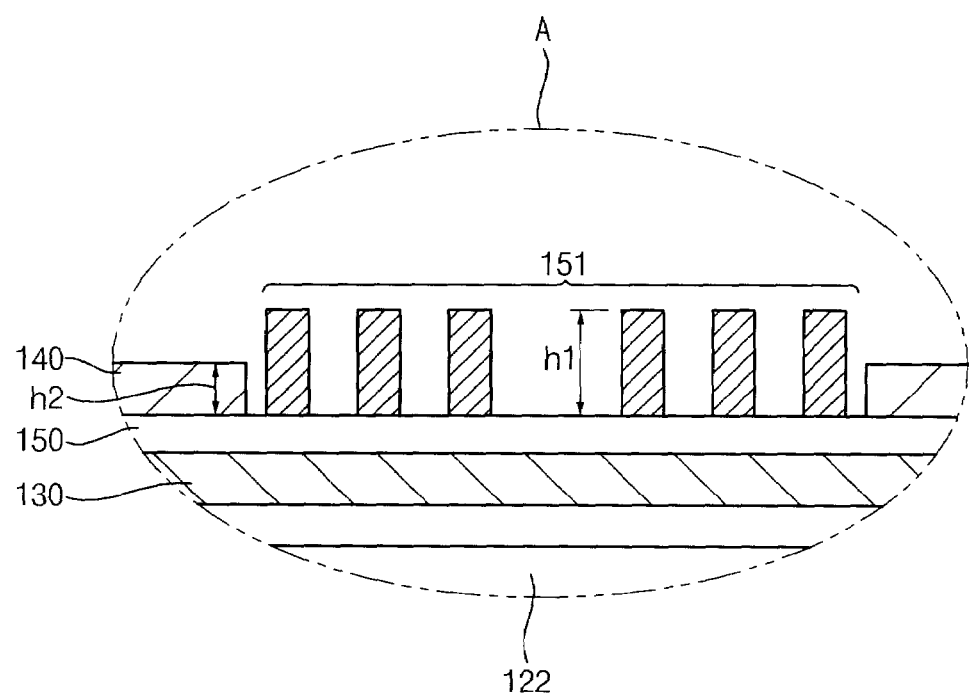
FIG. 3B is an enlarged plan illustrating portion 'A' in FIG. 3A.

FIG. 3A is a cross-sectional view illustrating the LCD module in FIG. 1, which is taken along line I-I'. FIG. 3B is an enlarged plan view illustrating portion 'A' in FIG. 3A.

Referring to FIGS. 3A and 3B, the mold frame 130 receives the LCD panel 110 and the light source unit 120. The light source unit 120 includes an LED device 121 and a LGP 122. The LGP 122 is disposed at the rear surface of the LCD panel 110, and the LED device 121 is disposed at a side of the LGP 122 (e.g., facing an incident side of the LGP 122).

In an exemplary embodiment, a plurality of optical sheets (not shown) may be disposed between the LGP 122 and the LCD panel 110.

In an exemplary embodiment, when the driving circuit substrate 150 includes an FPCB, a thickness of the driving circuit substrate 150 may be formed to be relatively thin. The thickness of the driving circuit substrate 150 may be reduced because of the FPCB configuration, and thus the driving circuit substrate 150 may be relatively easily arranged in the LCD module 100. A component, such as the electrical circuit component 151 (FIG. 1), mounted on the driving circuit substrate 150 may be thicker than a base portion of the driving circuit substrate 150. The thickness of the driving circuit substrate 150 may be determined by a thickness of a portion of the driving circuit substrate 150 on which the circuit component 151 is mounted, and including the circuit component 151. As used herein, the thickness is relative to a vertical direction, such as illustrated in FIG. 3A.

Referring to FIGS. 1 and 3A, the circuit component 151 of the driving circuit substrate 150 is mounted corresponding to the first opening 141 of the bottom chassis 140. When the bottom chassis 140 covers the mold frame 130, the circuit component 151 of the driving circuit substrate 150 having a substantial thickness protrudes through the first opening 141 from an inside of the bottom chassis 140 to an outside of the LCD module 100. A remaining portion of the driving circuit substrate 150 (e.g., where the circuit component 151 is not disposed) overlaps with and is covered by the bottom chassis 140, and is fixed in position within the LCD module 100. A rear surface of the driving circuit substrate 150 faces an upper surface of the bottom chassis 140. Advantageously, the total thickness of the LCD module 100 may be reduced by a difference between a height h1 (or thickness) of the circuit component 151 and a height h2 (or thickness) of the bottom chassis 140, because the circuit component 151 protrudes through the first opening 141.

If the circuit component 151 is disposed directly on the bottom chassis 140, a total thickness of the LCD module 100 is increased. Instead, when the circuit component 151 is disposed on the driving circuit substrate 150, and extends through the first opening 141 of the bottom chassis 140, and protrudes to an outside of the LCD module 100, the total thickness of the LCD module 100 may be advantageously reduced.

Moreover, when the driving circuit substrate 150 includes an FPCB, which is weak to external forces, the bottom chassis 140 covers the FPCB so that the FPCB may be advantageously protected.

In a conventional bottom chassis, an additional fixing member may be required because the driving circuit substrate is disposed outside (e.g., at a rear of) the bottom chassis. For example, a double-sided tape may be disposed between the bottom chassis and the driving circuit substrate to fix the driving circuit substrate. Consequently, the total thickness of the LCD module is undesirably increased by the thickness of the double-sided tape.

However, as in the illustrated embodiment, the driving circuit substrate 150 is disposed at the inside the bottom chassis 140, and an additional fixing member such as the double-sided tape is not necessary. Advantageously, the total thickness of the LCD module may be decreased by the thickness of the additional fixing member (e.g., double-sided tape), since the additional fixing member is not necessary.

In an exemplary embodiment, a combining protrusion (not shown) may be formed at the rear surface of the mold frame 130, and a combining portion (not shown), such as an opening or groove, corresponding to the combining protrusion may be formed at the driving circuit substrate 150. When the combining protrusion of the mold frame 130 and the combining groove of the driving circuit substrate 150 are combined together, the driving circuit substrate 150 is fixed in a position such that it does not undesirably move laterally. In an exemplary embodiment, a protrusion having a stepped portion may be formed at the mold frame 130, and an opening having substantially the same shape with the protrusion may be formed in the driving circuit substrate 150 at an area corresponding to the protrusion. Advantageously, the driving circuit substrate 150 may be fixed in a horizontal direction.

Referring to FIG. 3A, the driving circuit substrate 150 may further include a first connecting part 153 electrically connecting the LCD panel 110 and the driving circuit substrate 150. The first connecting part 153 extends from the driving circuit substrate 150 and passes through an opening of the mold frame 130 to be connected to the LCD panel 110. The first connecting part 153 is bent along an exterior of the mold frame 130, passes to an interior of the mold frame 130 through the opening in the mold frame 130, and is electrically connected to the LCD panel 110.

In an exemplary embodiment, the first connecting part 153 may be integrally formed and/or directly connected with the driving circuit substrate 150. Alternatively, the first connecting part 153 may be electrically connected to the driving circuit substrate 150 through an additional connector (not shown).

Figure 4:
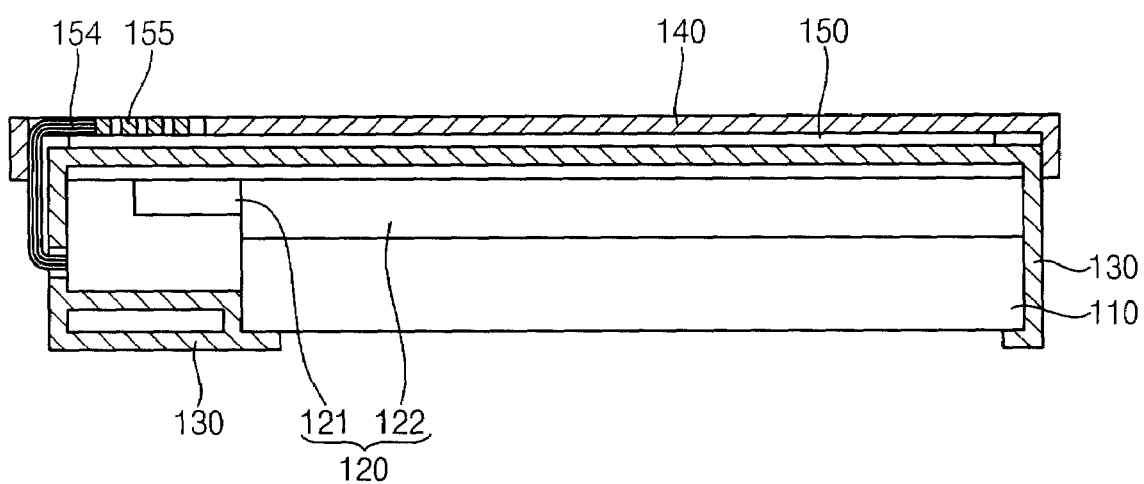
FIG. 4 is a cross-sectional view taken along line II-II' and illustrating the LCD module in FIG. 1.

FIG. 4 is a cross-sectional view taken along line II-II' illustrating the LCD module in FIG. 1.

Referring to FIG. 4, the mold frame 130 receives the LCD panel 110 and the light source unit 120. The light source unit 120 includes the LED device 121 and the LGP 122. The LGP 122 is disposed at the rear surface of the LCD panel 110, and the LED device 121 is disposed at the side of the LGP 122.

When the driving circuit substrate 150 is electrically connected to the light source unit 120, the driving circuit substrate 150 and the light source unit 120 may be connected by a soldering electrical combination disposed at the driving circuit substrate 150. The soldering part 155 is a connecting part electrically connecting the driving circuit substrate 150 and the light source unit 120. In an exemplary embodiment, the driving circuit substrate 150 and a second connecting part 154 are electrically connected at the soldering part 155. The second connecting part 154 electrically connects the LED device 121 of the light source unit 120 to the driving circuit substrate 150, and controls power and a control signal for driving the LED device 121.

In an exemplary embodiment, the second connecting part 154 may be integrally formed with and/or directly connected to the driving circuit substrate 150. Alternatively, the second connecting part 154 may be electrically connected to the driving circuit substrate 150 through a separate connector (not shown).

An electrical connecting part printed on the FPCB of the driving circuit substrate 150 has a relatively small thickness. The soldering part 155 electrically connected to the LED device 121 has a thickness greater than the electrical connecting part disposed on the FPCB of the driving circuit substrate 150, such that the soldering part 155 may cause an undesirable increase of the total thickness of the LCD module 100.

As in the illustrated embodiment, the soldering part 155 may protrude from the driving circuit substrate 150 and through the second opening 142 (FIG. 1) to an outside of the LCD module 100. When the soldering part 155 protrudes towards the outside of the LCD module 100, only the thickness of the soldering part 155 is greater than the remaining portion of the driving circuit substrate 150. Advantageously, the total thickness of the LCD module 100 may be reduced.

The soldering part 155 of the driving circuit substrate 150 is formed in an area corresponding to the second opening 142 of the bottom chassis 140. When the bottom chassis 140 covers the mold frame 130, the soldering part 155 having the thickness greater than the remaining portion of the driving circuit substrate 150 is protruded through and extended out of the second opening 142, such as to the outside of the LCD module 100. Advantageously, the LCD module 100 may be formed as a thinner shape.

Referring again to FIG. 1, the driving circuit substrate 150 may include a connector part 156. The driving circuit substrate 150 receives a data signal and driving power through the connector part 156 from an external device (not shown).

The third opening 143 is formed through the bottom chassis 140 to reduce the total thickness of the LCD module 100, such as when the connector part 156 is electrically connected to the driving circuit substrate 150 and exits outwards (e.g., laterally, or horizontally) to an outside of the LCD module as illustrated in FIG. 1.

In an exemplary embodiment, the connector part 156 may include a FPCB, and/or may be integrally formed with the driving circuit substrate 150. The connector part 156 may be formed to exit at a side of the bottom chassis 140 as illustrated in FIG. 1.

Figure 5:
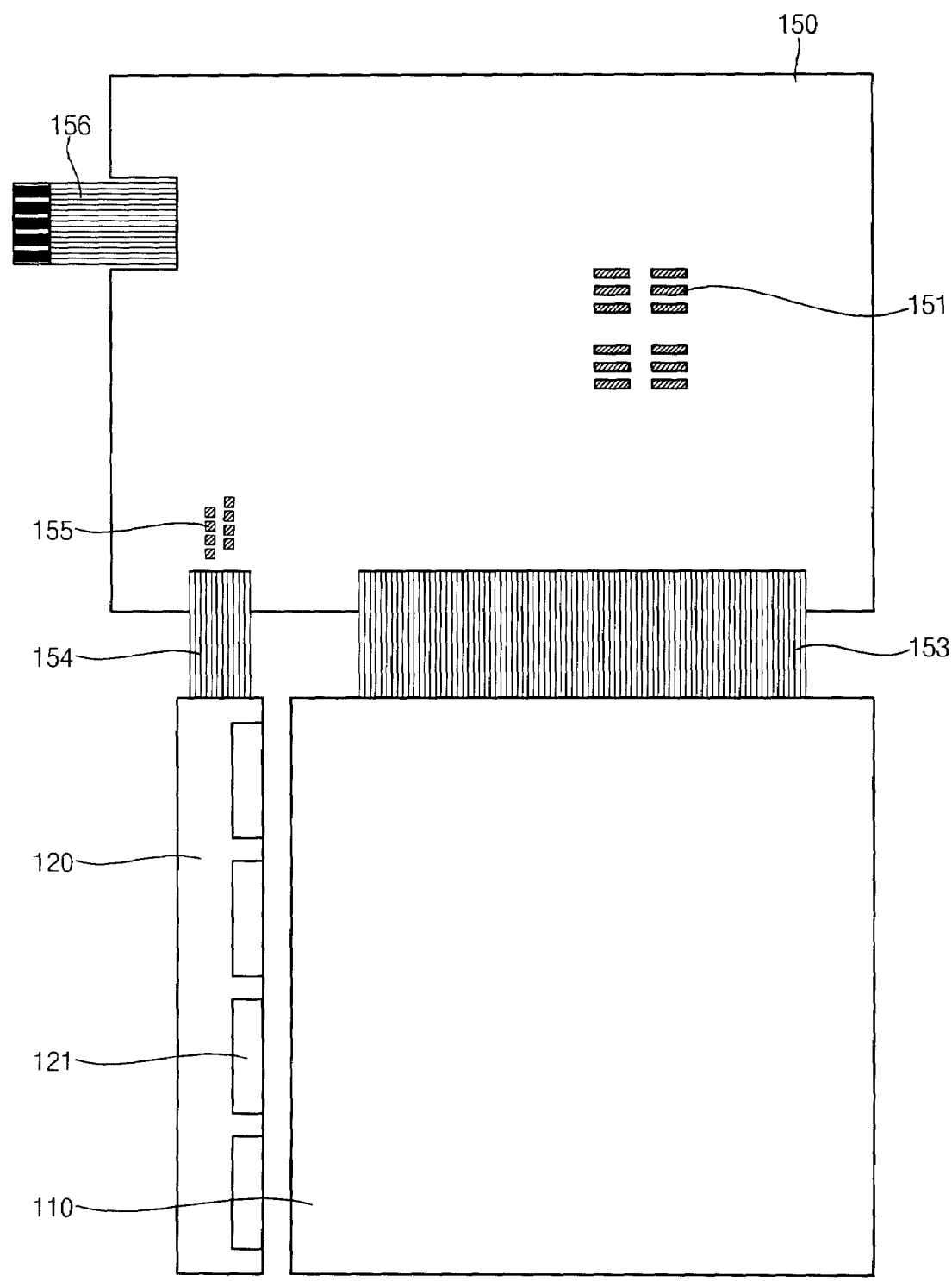
FIG. 5 is a plan view illustrating an exemplary embodiment of a driving circuit substrate, an LCD panel and a light source unit of the LCD module in FIG. 1.

FIG. 5 is a plan view illustrating an exemplary embodiment of a driving circuit substrate, an LCD panel and a light source unit of the LCD module in FIG. 1.

The driving circuit substrate 150 drives the LCD panel 110 and the LED device 121 of the light source unit 120. The driving circuit substrate 150 is electrically connected to the LCD panel 110 through the first connecting part 153, and is electrically connected to the light source unit 120 through the second connecting part 154. The light source unit 120 includes the LED device 121.

In an exemplary embodiment, the first connecting part 153 and the second connecting part 154 may include an FPCB.

Referring to FIG. 5, the driving circuit substrate 150 drives the LCD panel 110, such that a plurality of signals needs to be transferred to the LCD panel 110. The first connecting part 153 is formed as a substantially planar (e.g., plate) shape. An assembly of the LCD module 100 may be easier when the first connecting part 153 includes an FPCB, which is flexible and can be bent along the outside of the mold frame 130 (FIG. 3A).

When the LCD module 100 is assembled, the mold frame 130 is disposed between the LCD panel 110 and the driving circuit substrate 150. The LCD panel 110 and the driving circuit substrate 150 are disposed substantially parallel to each other. Advantageously, when the first connecting part 153 includes an FPCB, an assembly of the LCD module 100 may be simplified.

The second connecting part 154 electrically connects the driving circuit substrate 150 and the light source unit 120. In an exemplary embodiment, the second connecting part 154 may also include an FPCB, which is flexible and can be bent along the outside of the mold frame 130 (FIG. 4). Advantageously, an assembly of the LCD module may be easier when the second connecting part 154 include the FPCB.

The driving circuit substrate 150, the first connecting part 153 and the second connecting part 154 may be integrally formed. In one exemplary embodiment, the driving circuit substrate 150, the first connecting part 153 and the second connecting part 154 may be integrally formed on one FPCB.

Figure 6:
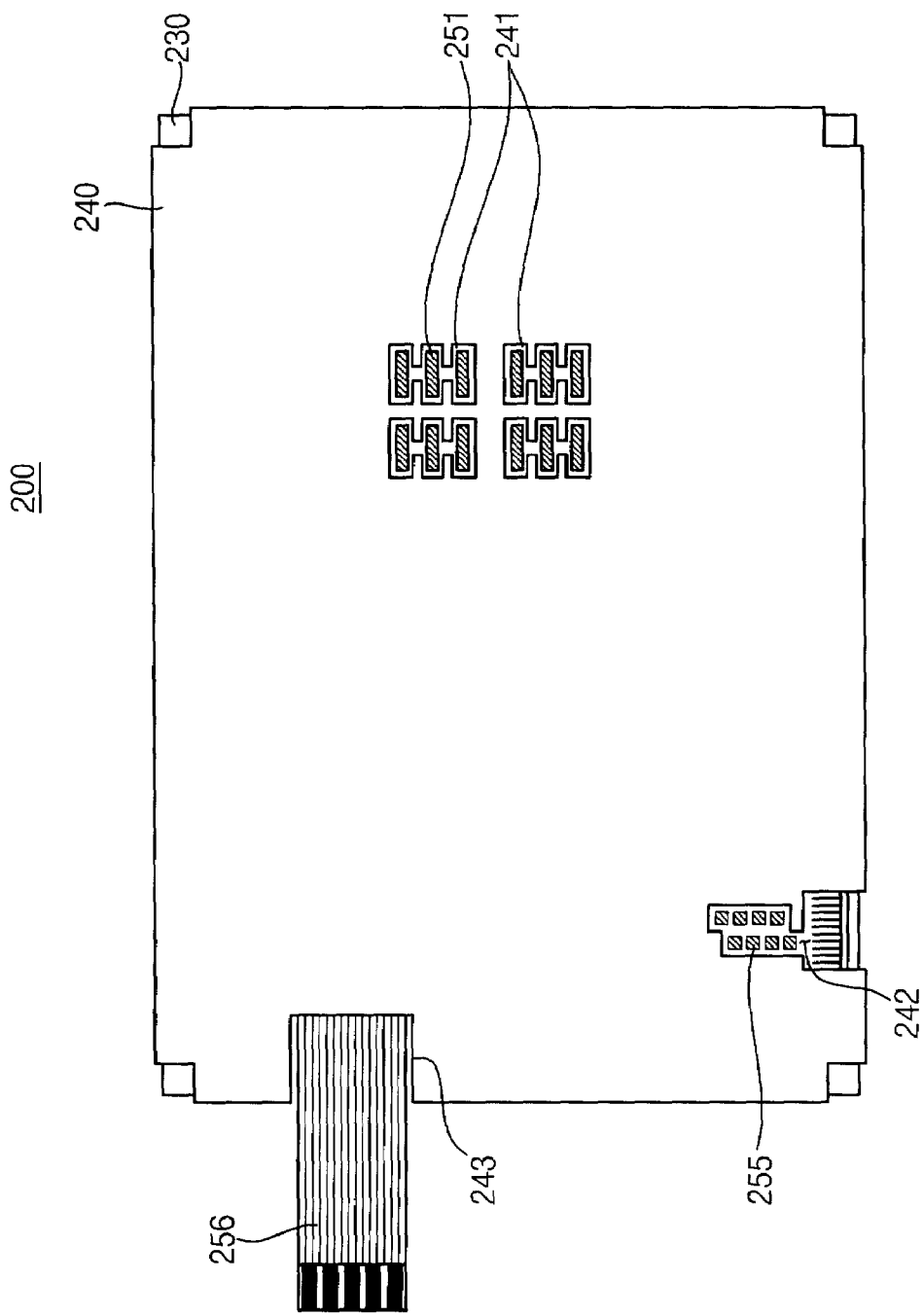
FIG. 6 is a plan view illustrating another exemplary embodiment of an LCD module in accordance with the present invention.

FIG. 6 is a plan view illustrating another exemplary embodiment of an LCD module in accordance with the present invention.

The LCD module 200 of FIG. 6 is substantially the same as the LCD module 100 in FIG. 1 except for a bottom chassis 240. Any further repetitive explanation concerning the above elements will be omitted.

Referring to FIG. 6, the LCD module 200 includes an LCD panel (not shown), a light source unit (not shown), a mold frame 230, a bottom chassis 240 and a driving circuit substrate.

The LCD panel (not shown) displays images using light provided from the light source unit (not shown).

The mold frame 230 receives the light source unit (not shown) and the LCD panel (not shown).

In an exemplary embodiment, the mold frame 230 may include only sidewall parts, and may not include a bottom part. When the mold frame 230 includes a bottom part, the bottom part supports the light source unit (not shown) and a reflective sheet of the light source unit (not shown).

The bottom chassis 240 includes first, second and third openings 241, 242 and 243. The bottom chassis 240 covers the mold frame 230. The driving circuit substrate is disposed between the bottom chassis 240 and the mold frame 230. The bottom chassis 240 protects the mold frame 230, the LCD panel (not shown) and the light source unit (not shown) received in the mold frame 230, and the driving circuit substrate.

The driving circuit substrate includes an electronic circuit component 251, a fixing (e.g., soldering) part 255 and a connector part 256. The electronic circuit component 251 may include an electronic chip or an electronic component for driving the LCD panel. The electronic circuit component 251 is mounted on the driving circuit substrate. The soldering part 255 electrically connects the driving circuit substrate and the light source device of the light source unit. The connector part 256 is connected with the driving circuit substrate and an external device (not shown). The connector part 256 is provided with a driving circuit signal and power.

In an exemplary embodiment, the driving circuit substrate may include an FPCB.

The bottom chassis 240 includes the first, second and third openings 241, 242 and 243. The first, second and third openings 241, 242 and 243 are formed at areas corresponding to the circuit component 251, the soldering part 255 and the connector part 256 of the driving circuit substrate, respectively.

Instead of being openings being formed in a relatively large area surrounding the circuit component 251, the soldering part 255 and the connector part 256 of the driving circuit substrate, openings may be more closely arranged around a profile of these elements. As illustrated in FIG. 6, the first opening 241 is formed substantially the same as an outline (e.g., profile in a plan view) of the circuit component 251. The first opening 241 may be formed only slightly larger than the outline of the circuit component 251. The second and third openings 242 and 243 are formed as substantially the same as outlines of the soldering part 255 and the connector part 256, respectively. The second and third openings 242 and 243 may be formed slightly larger than the outlines of the soldering part 255 and the connector part 256, respectively.

The first, second and third openings 241, 242 and 243 are formed to reduce height differences in the LCD module 200. Each of the first, second and third openings 241, 242 and 243 is combined with the circuit component 251, the soldering part 255 and the connector part 256, respectively. The driving circuit substrate is fixed in a direction substantially parallel to the bottom chassis 240, such as parallel to a bottom portion of the bottom chassis 240.

When the LCD module 200 is assembled, the driving circuit substrate is disposed between the bottom chassis 240 and the mold frame 230. The bottom chassis 240 covers the mold frame 230, thereby fixing the driving circuit substrate.

In an exemplary embodiment, the bottom chassis 240 may include at least one bent surface (not shown) to reduce or prevent the driving circuit substrate from moving and getting scratched. The bent surface (not shown) buffers external impacts and protects the driving circuit substrate.

As in the illustrated embodiment, an additional adhering member, such as a double-sided tape, may not be needed to fix the driving circuit substrate to the bottom chassis 240, and may not be used in the assembly of the LCD module 200. Advantageously, the total thickness of the LCD module 200 may be decreased by the thickness of the double-sided tape.

In an exemplary embodiment, a combining protrusion (not shown) may be formed at the rear surface of the mold frame 230, and a combining portion (not shown), such as an opening or groove, corresponding to the combining protrusion is formed at the driving circuit substrate. When the combining protrusion of the mold frame 230 and the combining groove of the driving circuit substrate are combined together, the driving circuit substrate is fixed in a set position such that it does not undesirably move laterally or horizontally.

Alternatively, a combining protrusion (not shown) may be formed at an upper surface of the bottom chassis 240, and a combining portion (not shown), such as an opening or groove, corresponding to the combining protrusion is formed at the driving circuit substrate. When the combining protrusion of the bottom chassis 240 and the combining groove of the driving circuit substrate are combined together, the driving circuit substrate is fixed in a set position such that it does not undesirably move laterally or horizontally.

In an exemplary embodiment, a protrusion having a stepped portion may be formed at the mold frame 230, and an opening having substantially the same shape with the protrusion may be formed at an area corresponding to the protrusion. Thus, the driving circuit substrate may be fixed in a horizontal direction.

Moreover, when the driving circuit substrate includes an FPCB, which is weak to external forces, the bottom chassis 240 covering the FPCB advantageously protects the FPCB and reduces or effectively prevents damage to the FPCB.

In the exemplary embodiments, openings of a rear surface of a bottom chassis are formed corresponding to components of a driving circuit substrate. When the bottom chassis is combined with the driving circuit substrate, the components are accommodated in the openings. Advantageously, a total thickness of an LCD module may be reduced by the thickness of the components of the driving circuit substrate.

Moreover in the exemplary embodiments, the driving circuit substrate is disposed between the bottom chassis and a mold frame. An additional adhering member such as a double-sided tape to fix the driving circuit substrate at a rear surface of the bottom chassis may not be needed. Advantageously, the total thickness of the LCD module may be further reduced by the thickness of the adhering member.

Furthermore in the exemplary embodiments, a soldering part electrically connecting the driving circuit substrate and a light source device may have a relatively large thickness compared to the driving circuit substrate. Since the soldering part is formed corresponding to one of the openings of the bottom chassis and is received through the opening, the thickness of LCD module may be advantageously reduced by the thickness of the soldering part.

It may be appreciated by those skilled in this art that many modifications, substitutions and variations can be made in and to the materials, apparatus, configurations and methods of the display panels of the present invention without departing from its spirit and scope. In light of this, the scope of the present invention should not be limited to that of the particular embodiments illustrated and described herein, as they are only exemplary in nature, but instead, should be fully commensurate with that of the claims appended hereafter and their functional equivalents.

What is claimed is:

1. A liquid crystal display ("LCD") module comprises:
   an LCD panel;
   a light source unit supplying light to the LCD panel;
   a mold frame including a bottom part and a sidewall part, and receiving the LCD panel and the light source unit;
   a bottom chassis disposed at a rear of the mold frame and covering the mold frame, and including a first opening;
   a driving circuit substrate disposed between the mold frame and the bottom chassis, and including a circuit component being disposed corresponding to the first opening of the bottom chassis;
   a first connecting part electrically connecting the LCD panel and the driving circuit substrate; and
   a second connecting part electrically connected to the driving circuit substrate at the soldering part, and
   wherein,
   the bottom chassis further includes a second opening and a third opening, and
   the driving circuit substrate further includes a connector part corresponding to the second opening of the bottom chassis and a soldering part disposed corresponding to the third opening of the bottom chassis, the connector part being electrically connected to an exterior device.

2. The LCD module of claim 1, wherein the driving circuit substrate further includes an LCD panel driving part.

3. The LCD module of claim 1, wherein the driving circuit substrate further includes a light source driving part.

4. The LCD module of claim 1, wherein the driving circuit substrate further includes a flexible printed circuit board ("FPCB").

5. The LCD module of claim 1, wherein
   the mold frame further includes an opening, and
   the first connecting part extends from the driving circuit substrate, passes through the opening of the mold frame, is bent along an exterior of the mold frame, and is electrically connected to the LCD panel.

6. The LCD module of claim 1, wherein the first connecting part is integral with the driving circuit substrate.

7. The LCD module of claim 1, further comprising a connector disposed between the first connecting part and the driving circuit substrate, the connector electrically connecting the driving circuit substrate and the first connecting part.

8. The LCD module of claim 1, wherein the second connecting part is integral with and directly connected to the driving circuit substrate.

9. The LCD module of claim 1, further comprising a connector disposed between the second connecting part and the driving circuit substrate, the connector electrically connecting the driving circuit substrate and the second connecting part.

10. The LCD module of claim 1, wherein
    the bottom chassis further includes a second opening,
    the driving circuit substrate further includes a soldering part disposed corresponding to the second opening of the bottom chassis, and
    the second connecting part is electrically connected to the driving circuit substrate at the soldering part.

11. The LCD module of claim 1, wherein the driving circuit substrate is disposed substantially coincident with a part or all of a sidewall of the bottom chassis, the driving circuit substrate being fixed when the bottom chassis covers the mold frame.

12. The LCD module of claim 1, wherein the mold frame further includes a combination protrusion disposed at a rear surface of the mold frame,
    and the driving circuit substrate further includes a combination groove disposed corresponding to the combination protrusion of the mold frame, the driving circuit substrate being fixed in the mold frame when the combination groove and the combination protrusion are combined.

13. The LCD module of claim 1, wherein
    the bottom chassis further includes a combination protrusion disposed at a surface facing the driving circuit substrate,
    and the driving circuit substrate further includes a combination groove disposed corresponding to the combination protrusion of the bottom chassis, the driving circuit substrate being fixed in the bottom chassis when the combination groove and the combination protrusion are combined.

14. The LCD module of claim 1, wherein the light source unit comprises a light-emitting diode ("LED") device.

15. The LCD module of claim 1, wherein the light source unit comprises a light-guide plate ("LGP").

16. The LCD module of claim 15, further comprising a plurality of optical sheets disposed between the LGP and the LCD panel.

17. The LCD module of claim 1, further comprising a reflective sheet disposed between the light source unit and the mold frame.

18. The LCD module of claim 1, wherein the bottom part of the mold frame comprises a second opening, and the mold frame is substantially frame shaped.

19. The LCD module of claim 1, wherein a height of the circuit component of the driving circuit substrate is substantially a same thickness as the bottom chassis, or greater than the thickness of the bottom chassis.

20. The LCD module of claim 1, wherein the bottom chassis further includes at least one bent surface corresponding to the sidewall part of the mold frame, the bent surface preventing the driving circuit substrate from moving or being scratched.

21. The LCD module of claim 1, wherein the first opening of the bottom chassis is disposed adjacent to an edge of the bottom chassis.

22. The LCD module of claim 1, wherein the first opening of the bottom chassis is disposed at a center portion of the bottom chassis, and corresponding to the circuit component of the driving circuit substrate.

* * * * *